(12) United States Patent
Bakshi et al.

(10) Patent No.: US 7,760,341 B2
(45) Date of Patent: Jul. 20, 2010

(54) SYSTEMS AND METHODS FOR IN-SITU REFLECTIVITY DEGRADATION MONITORING OF OPTICAL COLLECTORS USED IN EXTREME ULTRAVIOLET (EUV) LITHOGRAPHY PROCESSES

(75) Inventors: Vivek Bakshi, Austin, TX (US); Stefan Wurm, Austin, TX (US)

(73) Assignees: Sematech, Inc., Austin, TX (US); Infineon Technologies, Munich (DE)

( * ) Notice: Subject to any disclaimer, the term of this patent is extended or adjusted under 35 U.S.C. 154(b) by 366 days.

(21) Appl. No.: 11/849,797

(22) Filed: Sep. 4, 2007

(65) Prior Publication Data

US 2009/0059196 A1    Mar. 5, 2009

(51) Int. Cl.
*G03C 5/00* (2006.01)
*G01J 3/10* (2006.01)

(52) U.S. Cl. .............. 356/51; 356/480; 250/492.2; 250/504 R; 430/30

(58) Field of Classification Search ............. 356/51, 356/480
See application file for complete search history.

(56) References Cited

U.S. PATENT DOCUMENTS 6,822,251 B1  11/2004  Arenberg et al. ....... 250/504 R
6,841,322 B1 *  1/2005  Lee ........................... 430/30
7,180,083 B2 *  2/2007  Partlo et al. ............ 250/504 R
7,462,841 B2 * 12/2008  Franken et al. .......... 250/492.2
2003/0058429 A1  3/2003  Schriever .................. 355/133
2006/0160031 A1  7/2006  Wurm et al. ............... 430/322
2007/0023705 A1 *  2/2007  Partlo et al. ............ 250/504 R

OTHER PUBLICATIONS

J.H. Underwood, E.M. Guilkson, Kinanh Nguyen, "Tarnishing of Mo/Si multilayer x-ray mirrors", Applied Optics Dec. 1993, vol. 32, No. 34 pp. 6985-6990.*

* cited by examiner

*Primary Examiner*—Gregory J Toatley, Jr.
*Assistant Examiner*—Rebecca C Slomski
(74) *Attorney, Agent, or Firm*—Fulbright & Jaworski L.L.P.

(57) ABSTRACT

Systems and methods for in-situ reflectivity degradation monitoring of optical collectors used in extreme ultraviolet (EUV) lithography processes are described. In one embodiment, a method comprises providing a semiconductor lithography tool employing an EUV source optically coupled to a collector within a vacuum chamber, the collector providing an intermediate focus area, measuring a first signal at the EUV source, measuring a second signal at the intermediate focus area, comparing the first and second signals, and monitoring a reflectivity parameter of the collector based upon the comparison. In another embodiment, a method comprises emitting a signal from a non-EUV light source optically coupled to the collector, measuring a signal reflected by the collector, and monitoring a reflectivity parameter of the collector based upon a comparison between the emitted and measured signals.

14 Claims, 3 Drawing Sheets

SYSTEMS AND METHODS FOR IN-SITU REFLECTIVITY DEGRADATION MONITORING OF OPTICAL COLLECTORS USED IN EXTREME ULTRAVIOLET (EUV) LITHOGRAPHY PROCESSES

BACKGROUND OF THE INVENTION

1. Field of the Invention

The present invention relates to semiconductor fabrication, and more particularly to systems and methods for in-situ reflectivity degradation monitoring of optical collectors used in extreme ultraviolet (EUV) lithography processes.

2. Description of Related Art

Semiconductor fabrication typically involves dozens, or even hundreds of individual operations. In general terms, these operations can be classified as: layering, patterning, doping, and heat treatments. Among these, patterning (also referred to as "lithography") is generally considered to be the most critical operation because it sets the physical dimensions of the resulting devices on the semiconductor wafer.

Patterning comprises a series of steps by which selected portions of material deposited on the wafer surface are removed, thus leaving a "pattern" thereon. The sequence of steps may be described as follows. First, a pattern is formed on a photomask or reticle—e.g., a glass or quartz plate having a thin layer of chrome thereon. Then, the photomask is imaged or printed onto a layer of photoresist deposited on the wafer. Etching agents remove portions of the wafer not covered by the photoresist, and the photoresist itself is removed in subsequent steps. The transfer of the pattern from the photomask onto the photoresist is performed using some form of light source or electromagnetic radiation.

The wavelength of the light source used during the lithography process is directly proportional to the size of the features that can ultimately be fabricated on the semiconductor wafer. Hence, the continuous desire to create increasingly small semiconductor devices has created a need for light sources capable of emitting very short wavelength radiation. One such light source is the extreme ultraviolet (EUV) plasma source. EUV radiation may be generated in the 13.5 nm wavelength range by a plasma-based process whereby a fuel material such as xenon, lithium, indium, tin, etc. is heated to high temperatures. This intense heat may be achieved through the use of a focused laser beam, plasma pinch electrodes applying high-energy, short-duration pulses, or the like.

Some EUV sources employ collectors to gather and redirect the radiation that they generate. For example, grazing angle collectors are typically used with gas-driven sources, whereas near normal incidence multi-layer (ML) mirror collectors, so-called distributive Bragg reflectors, are used with laser produced sources. One illustrative collector optical assembly is described in U.S. Pat. No. 6,822,251 to Arenberg et al. To increase the lifetime of a collector, the surface of the collector may be covered with a protective coating made of transition or noble metals or oxides or nitrides of such metals. Unfortunately, this coating can be gradually eroded over time due to the highly energetic ions emitted from high-power EUV sources. The loss of reflectivity invariably leads to throughput loss in lithography processes. Consequently, collectors are typically replaced once they have lost about 10% of their peak reflectivity. Furthermore, if the degradation is not uniform across the collector's surface, the collector may have to be replaced even sooner.

Conventional methods for determining a collector's reflectivity involve the removal of the collector module from the semiconductor lithography tool. The collector module is then placed within a dedicated reflectivity measurement assembly, where measurements are conducted in an expensive and cumbersome procedure. These shortcomings are not intended to be exhaustive, but rather are among many that tend to impair the effectiveness of previously known techniques for measuring the reflectivity of EUV collectors. These issues are sufficient to demonstrate that the methodologies appearing in the art have not been satisfactory, and that a significant need exists for the systems and methods described and claimed herein.

BRIEF SUMMARY OF THE INVENTION

The present invention provides systems and methods for in-situ reflectivity degradation monitoring of optical collectors used in extreme ultraviolet (EUV) lithography processes. In one embodiment, a method comprises providing a semiconductor lithography tool employing an EUV source optically coupled to a collector within a vacuum chamber, the collector providing an intermediate focus area, measuring a first signal at the EUV source, measuring a second signal at the intermediate focus area, comparing the first and second signals, and monitoring a reflectivity parameter of the collector based upon the comparison. In another embodiment, an apparatus comprises a first detector optically coupled to an EUV source of a semiconductor lithography tool, the EUV source being optically coupled to a collector within a vacuum chamber, the collector providing an intermediate focus area, a second detector optically coupled to the intermediate focus area, a spectrometer coupled to the first and second detectors, and a controller coupled to the spectrometer, the controller being operable to compare a first signal generated by the first detector with a second signal generated by the second detector to monitor a reflectivity parameter of the collector based upon the comparison In one embodiment, a method comprises providing a semiconductor lithography tool employing an EUV source optically coupled to a collector within a vacuum chamber, emitting a signal from a non-EUV light source optically coupled to the collector, measuring a signal reflected by the collector, and monitoring a reflectivity parameter of the collector based upon a comparison between the emitted and measured signals. In another embodiment, an apparatus comprises an additional light source optically coupled to a collector, the collector being disposed within a vacuum chamber of a semiconductor lithography tool employing an EUV source, a detector optically coupled to the collector and operable to measure a signal emitted by the additional light source and reflected by the collector, a spectrometer coupled to the detector, and a controller coupled to the spectrometer, the controller being operable to monitor a reflectivity parameter of the collector based upon a comparison between the emitted and measured signals.

The term "coupled" is defined as connected, although not necessarily directly, and not necessarily mechanically. The terms "a" and "an" are defined as one or more unless this disclosure explicitly requires otherwise. The terms "substantially," "approximately," "about," and variations thereof are defined as being largely but not necessarily wholly what is specified, as understood by a person of ordinary skill in the art. In one non-limiting embodiment, the term substantially refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways other than those specifically described herein.

BRIEF DESCRIPTION OF THE SEVERAL VIEWS OF THE DRAWINGS

For a more complete understanding of the present invention, reference is now made to the following drawings, in which.

DETAILED DESCRIPTION OF THE INVENTION

In the following detailed description, reference is made to the accompanying drawings that illustrate embodiments of the present invention. These embodiments are described in sufficient detail to enable a person of ordinary skill in the art to practice the invention without undue experimentation. It should be understood, however, that the embodiments and examples described herein are given by way of illustration only, and not by way of limitation. Various substitutions, modifications, additions, and rearrangements may be made without departing from the spirit of the present invention. Therefore, the description that follows is not to be taken in a limited sense, and the scope of the present invention is defined only by the appended claims.

Typical EUV lithography sources operate by application of a large electrical field and/or high-energy laser to a fuel material such Xe, Li, In, Sn, etc. This causes the material to reach temperatures of about 30-40 eV (where 1 eV=11,604 K) by magnetic compression, laser-target interaction, or the like. At these temperatures, the fuel material emits electromagnetic radiation and debris. The debris include undesirable high energy ions and electrons, which may be at least partially treated using appropriate mitigation mechanisms. Meanwhile, the electromagnetic radiation emitted by the source is typically focused using a collector optical assembly.

Despite the presence of debris mitigation mechanisms, a portion of the high energy ions and electrons inevitably reaches the collector assembly. And, as previously noted, this causes the collector's surface coating to be eroded over time, thus resulting in loss of reflectivity. In some cases, this degradation may be non-uniform. To address these and other problems in an accurate and efficient manner, the present invention provides systems and methods for in-situ reflectivity degradation monitoring of optical collectors.

Figure 1A:
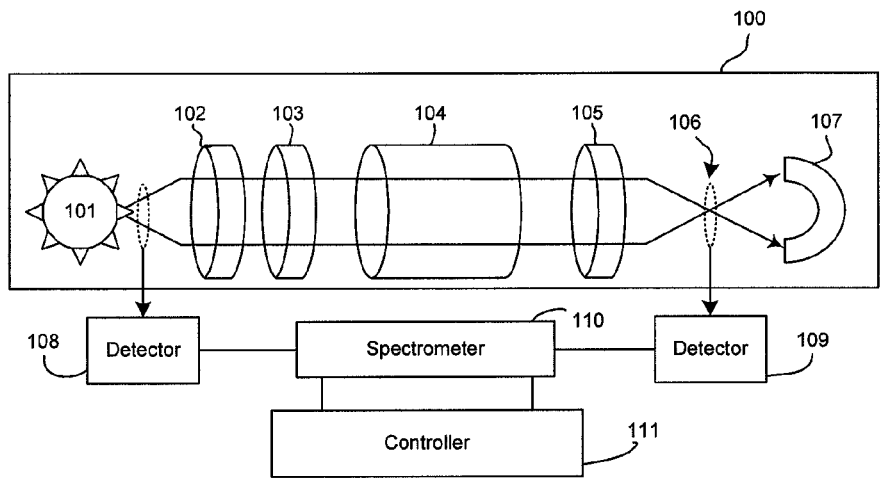
FIG. 1A is a block diagram of a reflectivity degradation monitoring system, according to one embodiment of the present invention.

Turning now to FIG. 1A, a block diagram of a reflectivity degradation monitoring system is depicted. EUV source 101 is coupled to gas curtain 102, debris mitigation filter 103, collector 104, spectral filter 105, and mirror 107. This system operates within high vacuum chamber 100 of a semiconductor fabrication apparatus or tool, and provides a first focus at source 101 and a second, intermediate focus (IF) at point 106. In lithography operations, focal point 106 is the region around which photomasks are positioned.

In one embodiment, collector 104 may be a grazing angle collector, generally used with gas driven plasma sources. Alternatively, collector 104 may be a normal incidence Si/Mo multi-layer mirror collector, generally used with laser produced plasma sources. In either case, in order to monitor the reflectivity degradation of collector 104, the system may provide first and second detectors 108 and 109 coupled to source 101 and IF point 106, respectively. Detectors 108 and 109 may also be coupled to spectrometer 110, and spectrometer 110 may be coupled to controller 111. In one embodiment, spectrometer 110 is a grazing angle (for deep UV spectrum) and/or Czerny-Turner (for UV to IR spectrum) spectrometer and detectors 108 and 109 are charge-coupled devices such as backside-illuminated cameras. In another embodiment (not shown), an optical switch may be used in conjunction with a single detector to replace both detectors 108 and 109. The switch may be coupled to source 101 and IF 106, for example, via optical fibers or the like, and may switch or multiplex between source 101 and IF 106 under command of controller 111.

EUV source 101 is often designed to generate light having wavelengths in the range of approximately 1 to 30 nm, and, more specifically at approximately 13.5 nm. This is the so-called "in-band" EUV radiation. Due to the nature of plasma radiation, however, EUV source 101 will also radiate energy in other portions of the spectrum—e.g., ultraviolet, visible, infrared, etc. When used in a lithography operation of semiconductor fabrication, this "out-of-band" EUV radiation is usually filtered out so that only (or mostly) in-band EUV radiation is used to image photomasks onto photoresists. Nonetheless, EUV source 101 typically emits electromagnetic radiation in many spectral bands including, for example, EUV (from about 1 to 30 nanometers), UV (from about 10 to about 400 nanometers), visible light (from about 360 to 740 nanometers), and infrared (from about 700 to 1000 nanometers).

In the embodiment shown in FIG. 1A, the detector-spectrometer-controller assembly is operable to determine the reflectivity degradation of EUV collector 104 by measuring out-of-band EUV radiation. In this case, detectors 108 and 109 need not be disposed within vacuum chamber 100, but may instead operate via flanged windows that provide optical access to source 101 and IF 106 as shown. In other embodiments, however, the detector-spectrometer-controller assembly may determine reflectivity degradation by measuring in-band EUV radiation. Accordingly, at least one of detectors 108 and 109 may be placed within vacuum chamber 100.

The inventors hereof have recognized that the radiation at source 101 is not substantially affected by the loss of collector 104 reflectivity and/or reflectivity non-uniformity, whereas the radiation at IF 106 decreases as the collector reflectivity worsens. For example, losses between IF 106 and source 101 are attributable to the presence of mitigation devices (e.g., debris filter 103), gas absorption, and limitations in the efficiency of collector 104, so that:

[Power at IF (λ)]=[Power at Source (λ)]×[Debris Mitigation Loss]×[Gas Absorption]×[Collector Efficiency (λ)]   Eq. 1.

It should be noted that the efficiency of collector 104 is proportional to its reflectivity index. Moreover, debris mitigation loss is wavelength independent and gas absorption does not change when collector reflectivity degrades. Therefore, one can effectively determine the changes in reflectivity of collector 104 by monitoring the ratio of power at IF 106 and source 101. And, for ML mirrors, the loss of reflectivity at EUV wavelengths is approximately the same as the non-EUV wavelengths (or it follows a pre-determined ratio). Accordingly, either one of detectors 108 and 109 may measure either in-band or out-of-band EUV signals. For example, detector 108 may measure in-band EUV power at source 101 (and thus be located within vacuum chamber 100), while detector 109 may measure out-of-band EUV power at IF 106 (and thus be located outside of vacuum chamber 100 via a flange or window). In this example, the rate at which the ratio of out-of-band EUV power (at IF 106) to in-band EUV power (at source 101) changes overtime is indicative of the reflectivity loss of collector 104.

In some embodiments, only the power at IF may be monitored and the power at source 101 may be assumed to be constant. In preferred embodiments, however, in order to properly account for power source drifts, surges, and the like, a ratio of power at IF 106 and source 101 may be used as discussed herein.

Figure 1B:
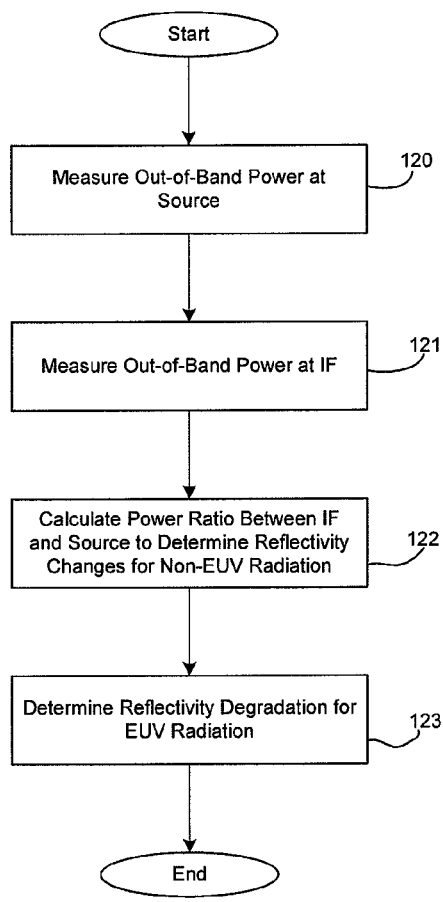
FIG. 1B is a flowchart of a method for determining the reflectivity degradation of a collector, according to one embodiment of the present invention.

In operation, the system of FIG. 1A may perform at least some of steps shown in the method depicted in flowchart of FIG. 1B to monitor the reflectivity degradation of EUV collector 104. In step 120, detector 108 detects an out-of-band EUV signal at source 101, and spectrometer 110 measures a non-EUV power or intensity at that point. In step 121, detector 109 detects another out-of-band EUV signal at IF 106, and spectrometer 110 measures a non-EUV power or intensity at IF 106. Controller 111 may acquire these values from spectrometer 111 and then it may calculate a power ratio between IF 104 and source 101 to determine reflectivity changes for non-EUV radiation, as shown in step 122. As the ratio changes over time, it may be used to infer the reflectivity degradation for out-of-band EUV radiation in step 123. Although steps 120-123 are described herein in terms of out-of band EUV measurements, the same principles may be applied when in-band EUV (or mixed in-band and out-of-band EUV) measurements are used.

The embodiments discussed in connection with FIGS. 1A-B enable the real-time monitoring of collector reflectivity degradation. Moreover, this monitoring may be performed during normal operation of the semiconductor manufacturing tool using this system. By measuring changes in reflectivity, the lifetime of collectors may be accurately estimated. Furthermore, the lifetime of debris mitigation filter may also be similarly inferred, for example, based upon how fast (or slow) the reflectivity degradation of the collector occurs. In other embodiments described in detail below, an additional light source may be used to scan a collector in-situ and thus provide a measure of uniformity across the surface of the collector.

Figure 2A:
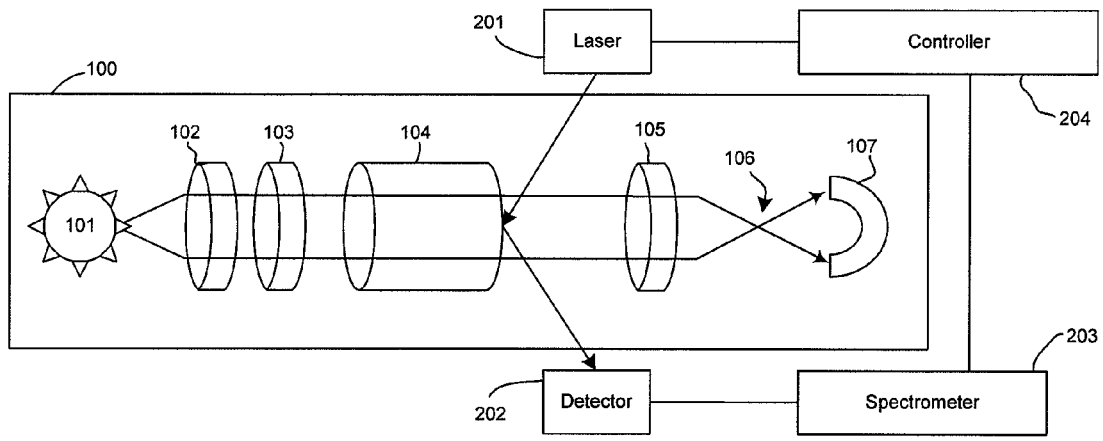
FIG. 2A is a block diagram of another reflectivity degradation monitoring system, according to another embodiment of the present invention.

Referring to FIG. 2A, a block diagram of another reflectivity degradation monitoring system is depicted. The assembly of elements 101-107 within vacuum chamber 100 is similar to the one shown in FIG. 1A. In this embodiment, however, additional laser source 210 is optically coupled to collector 104 via a flange or window in chamber 100. In addition, detector 202 is optically coupled to collector 104 and operable to detect a signal generated from laser 210 and reflected by collector 104. Detector 202 may be positioned alongside additional laser source 210 with access to collector 104 via the same flange or window of chamber 100. Alternatively, detector 202 may be placed in another window of chamber 100. Spectrometer 203 is coupled to detector 202, and controller 204 is coupled to spectrometer 203.

Additional laser source 201 may be a non-EUV source such as, for example a helium/neon (He/Ne) laser. Moreover, additional laser source 201 may be operable to scan the surface of collector 104 under command of controller 204. In this manner, in addition to being able to monitor the reflectivity degradation and lifetime of collector 104, the system of FIG. 2A is also capable to measure the degree of uniformity of such degradation. Although additional laser source 201 and detector 202 are depicted outside of vacuum chamber 100, one or both of these elements may be placed within chamber 100.

Figure 2B:
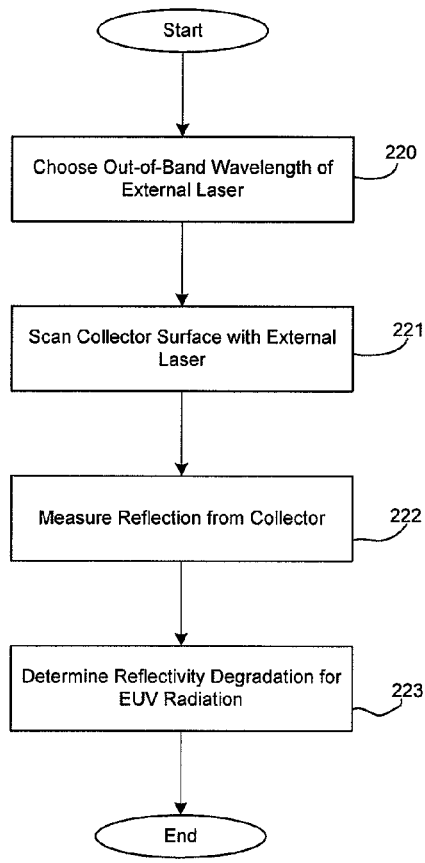
FIG. 2B is a flowchart of another method for determining the reflectivity degradation of a collector, according to another embodiment of the present invention.

In operation, the system of FIG. 2A may perform at least some of steps shown in the method depicted in flowchart of FIG. 2B to measure the reflectivity degradation of EUV collector 104. In step 220, an out-of-band, Non-EUV wavelength is chosen for additional laser source 201. During this step, the wavelength may preferably be chosen so as to avoid interference from the plasma source during reflectivity measurements. In step 221, controller 204 may command additional laser source 201 to scan the surface of collector 104. Detector 202 detects a signal reflected from collector 104 in step 222, and spectrometer 203 may calculate the power or intensity of the reflected signal. In step 223, the reflectivity degradation of collector 104 is determined. Again, the same principle that the loss of reflectivity at EUV wavelengths is approximately the same as the non-EUV wavelengths (or it follows a pre-determined ratio) for ML mirrors may be applied.

As noted above, in addition to being able to estimate the reflectivity loss and hence the lifetime of collector 104, controller 204 may be operable to monitor the uniformity of collector 104's surface by associating the coordinates of that surface with the signals emitted by additional laser source 201 and detected via detector 202. Controller 204 may also create a map of the surface of collector 104 showing a map of reflectivity (or reflectivity degradation, etc.) as a function of position on the surface, and may display the map to the user. Moreover, controller 204 may also alert an operator or automatically suspend operation of the semiconductor fabrication tool under monitoring when the reflectivity degradation and/or its non-uniformity of collector 104 is about to reach (or has already reached) a critical level—i.e., the lifetime of collector 104 has ended.

In one embodiment, controllers 111 or 204 may be microprocessors or microprocessor-based devices. The software, computer program logic, or code segments implementing various embodiments of the present invention may be stored in a computer readable medium of a computer program product. The term "computer readable medium" includes any physical medium that can store or transfer information. Examples of the computer program products include an electronic circuit, a semiconductor memory device, a ROM, a flash memory, an erasable ROM (EROM), a floppy diskette, a compact disk CD-ROM, an optical disk, a hard disk, and the like. Code segments may be downloaded via computer networks such as the Internet or the like.

Figure 3:
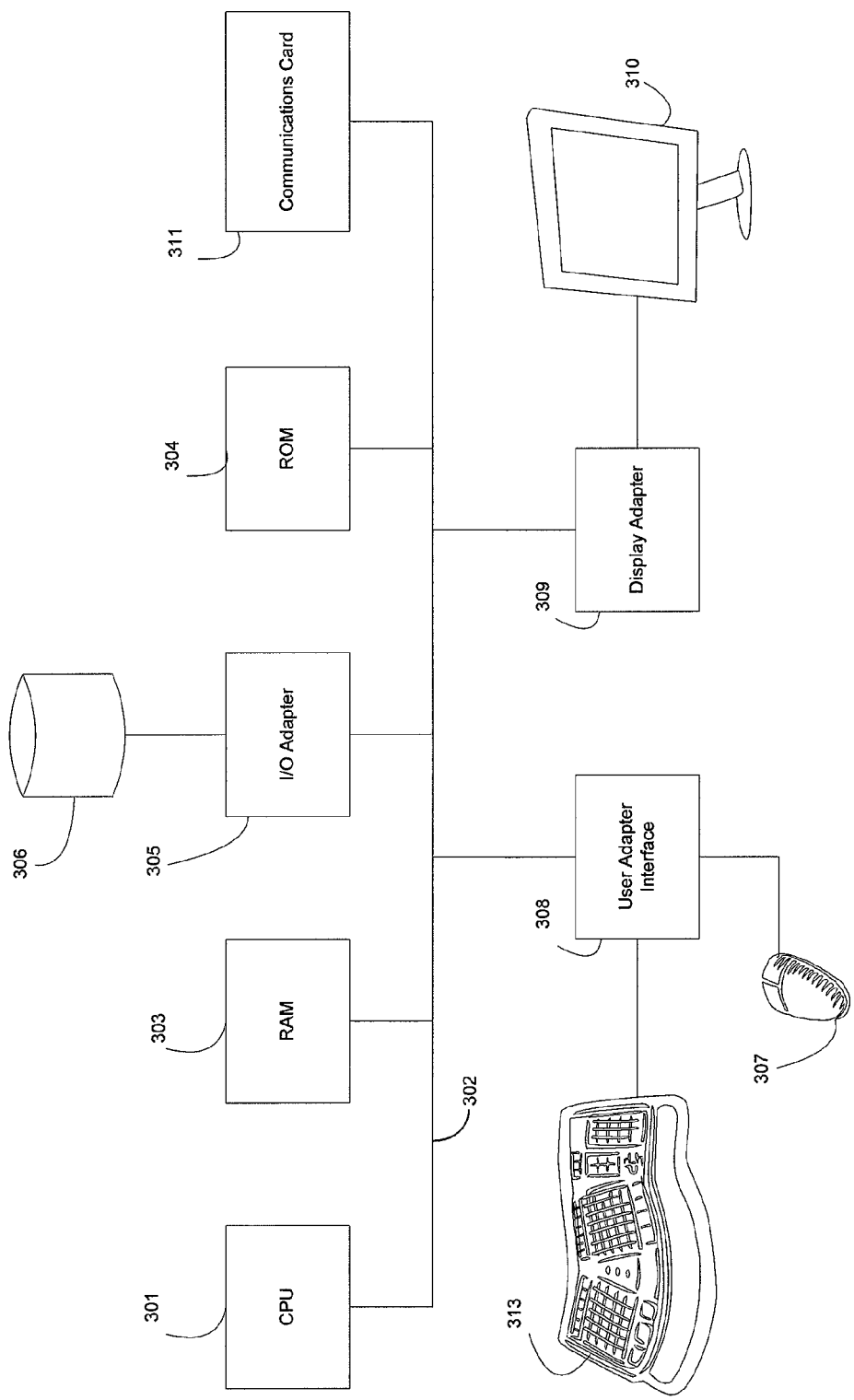
FIG. 3 is a block diagram of a controller according to an embodiment of the present invention.

FIG. 3 is a block diagram further illustrating controllers 111 or 204 in more detail according to one embodiment of the present invention. Central processing unit ("CPU") 301 is coupled to system bus 302. CPU 301 may be any general purpose CPU. However, embodiments of the present invention are not restricted by the architecture of CPU 301 as long as CPU 301 supports the inventive operations as described herein. Bus 302 is coupled to random access memory ("RAM") 303, which may be SRAM, DRAM, or SDRAM. ROM 304 is also coupled to bus 302, which may be PROM, EPROM, or EEPROM.

Bus 302 is also coupled to input/output ("I/O") controller card 305, communications adapter card 311, user interface card 308, and display card 309. I/O adapter card 305 connects storage devices 306, such as one or more of a hard drive, a CD drive, a floppy disk drive, a tape drive, to controller 210. I/O adapter 305 is also connected to a printer (not shown), to allow the system to print paper copies of information such as documents, photographs, articles, and the like. The printer may be a printer (e.g., dot matrix, laser, and the like), a fax machine, scanner, or a copier machine. Communications card 311 is adapted to couple controller 210 to source 201 and/or spectrometer 209. User interface card 308 couples user input devices, such as keyboard 313, pointing device 307, and the like, to controller 210. Display card 309 is driven by CPU 301 to control the display on display device 310.

Referring back to FIGS. 1A and 2A, controllers 111 or 204 may use card 311 to establish communicate with spectrometers 110 or 203 and/or to establish a control line with additional source 201 in order to carry out the monitoring and control functions detailed herein. Furthermore, controllers 111 or 204 may be used to store and/or execute software to implement, for example, the methods depicted above with respect to FIGS. 1B and 2B.

As a person of ordinary skill in the art will immediately recognize in light of this disclosure, the systems and methods described above provide numerous advantages over the prior art. For example, the present invention provides in-situ, real-time monitoring of collector reflectivity during normal operation of the semiconductor processing tool employing the same. This enables continuous production and avoids the need to periodically halt operations in order to remove the collector from the tool to verify that it is functioning within acceptable parameters, thus resulting in higher yields and substantial cost savings. Furthermore, some of the embodiments disclosed herein may utilize non-EUV measurements to monitor in-band EUV reflectivity, and thus need not operate in high vacuum and provide additional advantages over prior art systems.

Although certain embodiments of the present invention and their advantages have been described herein in detail, it should be understood that various changes, substitutions and alterations can be made without departing from the spirit and scope of the invention as defined by the appended claims. Moreover, the scope of the present invention is not intended to be limited to the particular embodiments of the processes, machines, manufactures, means, methods, and steps described herein. As a person of ordinary skill in the art will readily appreciate from this disclosure, other processes, machines, manufactures, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufactures, means, methods, or steps.

The invention claimed is:

1. A method, comprising:
providing a semiconductor lithography tool employing an extreme ultraviolet (EUV) source optically coupled to a collector within a vacuum chamber, the collector providing an intermediate focus area;
measuring a first signal at the EUV source;
measuring a second signal at the intermediate focus area;
comparing the first and second signals; and
monitoring a reflectivity parameter of the collector based upon the comparison.

2. The method of claim 1, further comprising monitoring a reflectivity parameter of the collector during a normal operation of the semiconductor lithography tool.

3. The method of claim 1, where measuring the first signal comprises measuring at least one of: a first in-band EUV signal and a first out-of-band EUV signal.

4. The method of claim 1, where measuring the second signal comprises measuring at least one of: a second in-band EUV signal and a second out-of-band EUV signal.

5. The method of claim 1, where comparing the first and second signals calculating a rate at which a ratio between the first and second signals changes over time.

6. The method of claim 5, where monitoring the reflectivity parameter comprises monitoring a reflectivity index of the collector.

7. The method of claim 5, where monitoring the reflectivity parameter comprises monitoring a reflectivity degradation.

8. The method of claim 7, further comprising estimating a collector lifetime based upon the reflectivity degradation.

9. The method of claim 1, further comprising alerting an operator when the reflectivity parameter of the collector reaches a pre-determined value.

10. An apparatus comprising:
a first detector optically coupled to an extreme ultraviolet (EUV) source of a semiconductor lithography tool, the EUV source being optically coupled to a collector within a vacuum chamber, the collector providing an intermediate focus area;
a second detector optically coupled to the intermediate focus area;
a spectrometer coupled to the first and second detectors; and
a controller coupled to the spectrometer, the controller being operable to compare a first signal generated by the first detector with a second signal generated by the second detector to monitor a reflectivity parameter of the collector based upon the comparison.

11. The apparatus of claim 10, where the first detector is placed within the vacuum chamber and it is operable to measure an in-band EUV signal from the EUV source.

12. The apparatus of claim 10, where the first detector is placed outside the vacuum chamber and it is operable to measure an out-of-band EUV signal from the EUV source.

13. The apparatus of claim 10, where the second detector is placed within the vacuum chamber and it is operable to measure an in-band EUV signal from the intermediate focus area.

14. The apparatus of claim 10, where the second detector is placed outside the vacuum chamber and it is operable to measure an out-of-band EUV signal from the intermediate focus area.

* * * * *